(12) United States Patent
Watanabe

(10) Patent No.: US 6,462,960 B1
(45) Date of Patent: Oct. 8, 2002

(54) HIGH FREQUENCY SHIELDING STRUCTURE AND METHOD

(75) Inventor: Hideo Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/552,883

(22) Filed: Apr. 20, 2000

(30) Foreign Application Priority Data

Apr. 22, 1999 (JP) .......................................... 11-114500

(51) Int. Cl.⁷ .................................................. H05K 9/00
(52) U.S. Cl. ........................ 361/816; 361/800; 361/818; 361/760; 361/761; 361/764; 428/68; 428/76; 174/35 R; 174/35 GC
(58) Field of Search .............................. 361/800, 816, 361/760, 761, 764, 818; 174/35 R, 35 GC; 428/68, 76

(56) References Cited

U.S. PATENT DOCUMENTS

| | | | |
|---|---|---|---|
| 3,140,342 A | | 7/1964 | Ehrreich et al. |
| 5,311,402 A | * | 5/1994 | Kobayashi et al. .......... 361/760 |
| 5,329,160 A | * | 7/1994 | Miura et al. ................ 257/710 |
| 5,763,824 A | * | 6/1998 | King et al. ................ 174/35 R |
| 5,821,161 A | * | 10/1998 | Covell, II et al. ........... 438/613 |
| 5,982,038 A | * | 11/1999 | Toy et al. .................... 257/772 |
| 6,114,761 A | * | 9/2000 | Mertol et al. ................ 257/722 |
| 6,210,815 B1 | * | 4/2001 | Ooishi ......................... 428/690 |
| 6,271,058 B1 | * | 8/2001 | Yoshida ...................... 438/108 |

FOREIGN PATENT DOCUMENTS

| | | |
|---|---|---|
| JP | 61-97048 | 5/1986 |
| JP | 6-163732 | 6/1994 |
| JP | 9-55597 | 2/1997 |
| JP | 2000-58692 | 2/2000 |
| WO | WO 98/08365 | 2/1998 |
| WO | WO 98/39957 | 9/1998 |

* cited by examiner

Primary Examiner—David Martin
Assistant Examiner—Thanh Y. Tran
(74) Attorney, Agent, or Firm—Sughrue Mion, PLLC

(57) ABSTRACT

In order to obtain electromagnetic shielding and hermetic shielding for a high frequency circuit easily and surely, a complex adhesive sheet is provided at the joint between a metal stem (1) and a metal cap. The complex adhesive sheet comprises an electromagnetic shielding adhesive sheet (21) and a hermetically sealing adhesive sheet (22) that have been joined by thermo-compression bonding into inside and outside ring shapes, respectively.

8 Claims, 5 Drawing Sheets

HIGH FREQUENCY SHIELDING STRUCTURE AND METHOD

BACKGROUND OF THE INVENTION (i) Field of the Invention

The present invention relates to shielding structures for a high frequency circuit for microwave or millimeter wave band, particularly to shielding structures and methods for a high frequency circuit to obtain both functions of electromagnetic shielding and hermetic seal by using a complex adhesive.

(ii) Description of the Related Art

A conventional shielding structure for a high frequency circuit for microwave or millimeter wave band will be described with reference to FIGS. 7A and 7B. FIGS. 7A and 7B illustrate a shielding structure in case of using a microwave integrated circuit (to be referred to as MIC hereinafter) as an example of high frequency circuit.

In these drawings, FIG. 7A shows a plan view of the MIC 10 and FIG. 7B shows a sectional view of the MIC 10 along the line A—A.

In FIGS. 7A and 7B, the reference numeral 1 denotes a metal base plate (to be referred to as metal stem hereinafter). The reference numeral 2 denotes a dielectric substrate which is mounted on the metal stem 1 and on which a high frequency circuit (e.g., a semiconductor chip for a high frequency amplifier, micro-strip lines, etc.) is formed. The reference numeral 3 denotes a metal cap covering the whole of the dielectric substrate 2 to serve for high frequency shielding. The reference numeral 4 denotes a conductive adhesive such as silver paste filling in the joint between the metal cap 3 and the metal stem 1 to bond them and to serve for electric shielding for the high frequency circuit. The reference numeral 5 denotes a hermetically sealing adhesive or welding applied to the whole outer periphery of the joint between the metal cap 3 and the metal stem 1 to serve for hermetic seal for the MIC. The reference numeral 6 denotes interface connection terminals for an external circuit, which terminals are hermetically sealed with the metal stem 1 and connected to the high frequency circuit of the dielectric substrate 2.

The conventional shielding structure for the high frequency circuit as described above has need of sufficient electric shielding because the high frequency circuit for microwave band is placed within the metal cap 3. Besides, it has need of sufficient hermetic shielding for preventing external moisture or the like from entering the interior of the MIC.

For the electric shielding condition, the conductive adhesive 4 is applied to the joint between the metal cap 3 and the metal stem 1 to ensure electric shielding. Besides, in order to meet the hermetic shielding condition, in addition to the above conductive adhesive 4, the hermetically sealing adhesive or welding 5 covers the whole periphery to obtain hermetic seal.

The conventional shielding structure for the high frequency circuit as described above has need of the hermetically sealing adhesive or welding 5 for hermetic shielding after applying the conductive adhesive 4 for electric shielding. So, shielding must be made through two stages of manufacturing processes, i.e., an electric shielding process and a hermetic shielding process.

For this reason, the conventional shielding structure for the high frequency circuit requires a complex working process and much time for manufacture.

SUMMARY OF THE INVENTION

It is an object of the present invention to provide shielding structure and method for a high frequency circuit with a simple manufacturing process and a great shielding effect.

A shielding structure for a high frequency circuit according to the present invention comprises:

a metal stem;

a high frequency circuit mounted on an upper portion of the metal stem;

a metal cap for covering the periphery of the high frequency circuit from above; and a complex adhesive in which a ring-shaped electromagnetic shielding adhesive and a ring-shaped hermetically sealing adhesive are joined by thermo-compression bonding, and which is provided at the joint between the metal cap and the metal stem.

DETAILED DESCRIPTION OF THE PREFERRED EMBODIMENTS

Hereinafter, shielding structures for a high frequency circuit according to embodiments of the present invention will be described with reference to drawings.

(Embodiment 1)

Figure 1A:
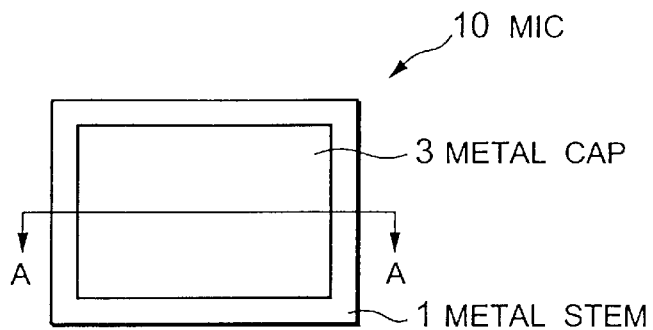
FIG. 1A is a plan view of a MIC using a shielding structure for a high frequency circuit according to an embodiment of the present invention.
Figure 1B:
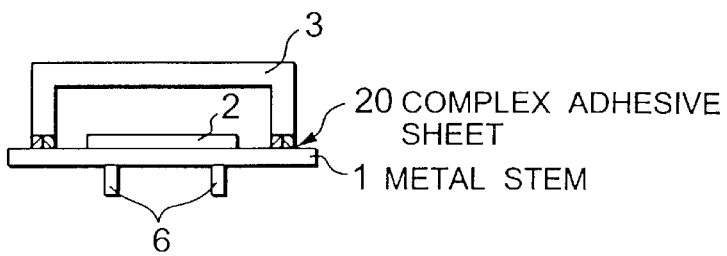
FIG. 1B is a sectional view of the MIC using the shielding structure for the high frequency circuit according to the embodiment of the present invention.
Figure 7A:
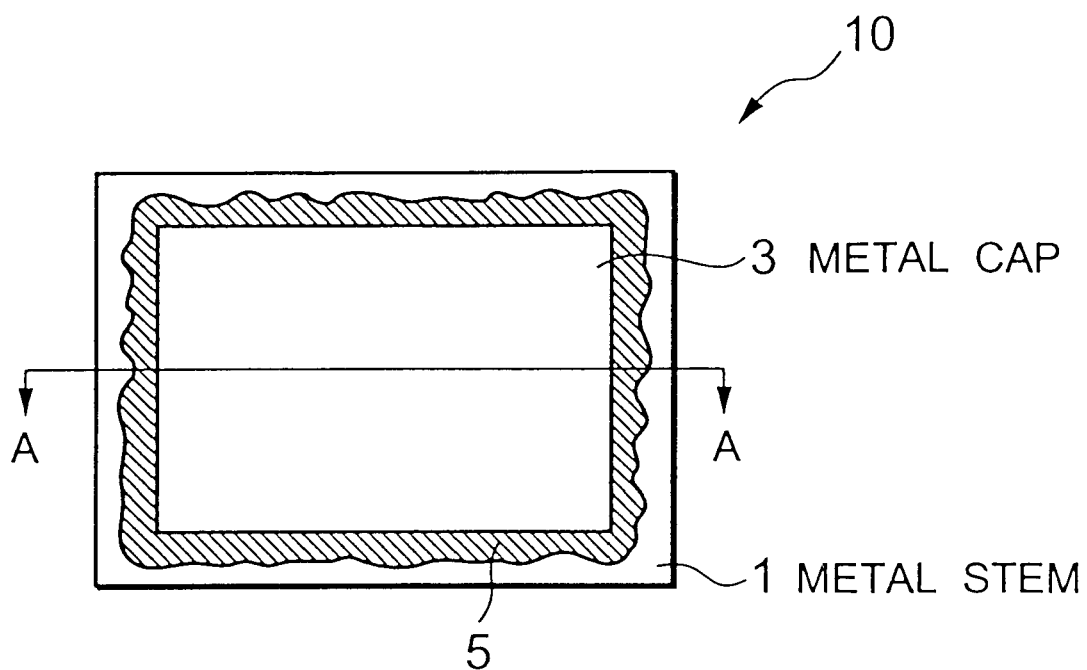
FIG. 7A is a plan view of a MIC using a conventional shielding structure for a high frequency circuit.
Figure 7B:
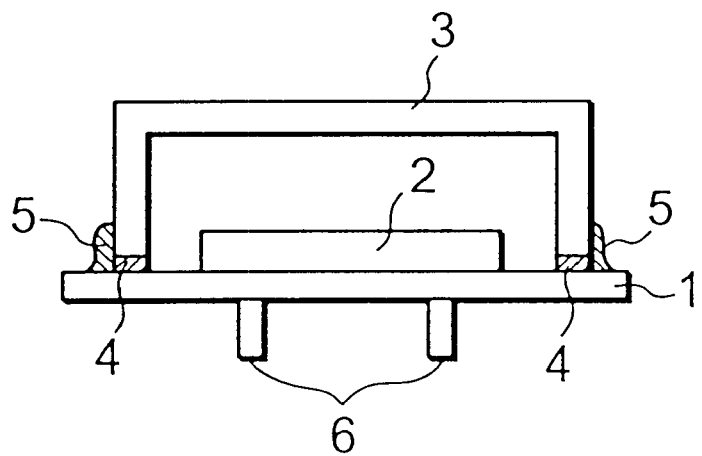
FIG. 7B is a sectional view of the MIC using the conventional shielding structure for the high frequency circuit.

FIGS. 1A and 1B illustrate a shielding structure for a high frequency circuit according to the present invention, wherein a microwave integrated circuit (to be referred to as MIC hereinafter) is used like FIGS. 7A and 7B.

In these drawings, FIG. 1A shows a plan view of the MIC 10 for explaining the shielding structure of the present invention, and FIG. 1B shows a sectional view of the MIC 10 along the line A—A. The same parts as in the conventional MIC 10 are respectively denoted by the same reference numerals as in the conventional MIC 10 and their description will be omitted.

The most characteristic feature of the present invention is in the point that a complex adhesive sheet (film-shaped) 20 is provided at the joint between a metal cap 3 and a metal stem 1 to serve for both functions of hermetic seal and electromagnetic shielding, without using the hermetically sealing adhesive or welding 5 as described in the prior art for hermetic shielding.

The structure of the complex adhesive sheet 20 will be described in detail with reference to drawings.

Figure 2A:
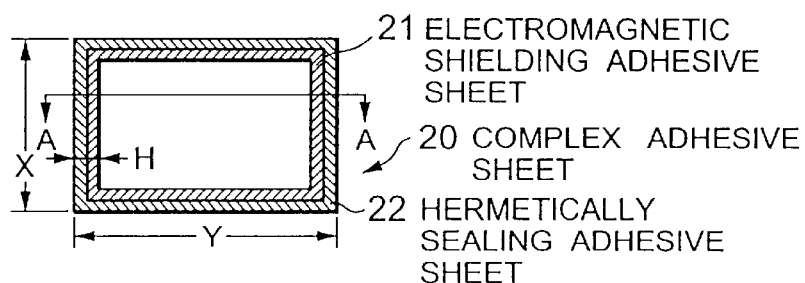
FIG. 2A is a plan view of a complex adhesive sheet according to the embodiment of the present invention.
Figure 2B:
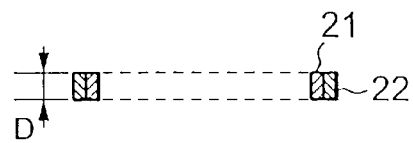
FIG. 2B is a sectional view of the complex adhesive sheet according to the embodiment of the present invention.

FIGS. 2A and 2B are plan and sectional views illustrating the structure of the complex adhesive sheet 20. Referring to these drawings, the complex adhesive sheet 20 is made into an adhesive sheet of a double ring structure in which two ring-shaped adhesive sheets different in material are bonded to each other. More specifically, the complex adhesive sheet 20 comprises an electromagnetic shielding adhesive sheet 21 as the inner ring and a hermetically sealing adhesive sheet 22 as the outer ring, both of which are joined by thermo-compression bonding.

This complex adhesive sheet 20 is stuck on the whole surface of the joint between the metal cap 3 and the metal stem 1. In this embodiment, the ring contour is rectangular because the joint between the metal cap 3 and the metal stem 1 has a rectangular contour. But, the contour of the complex adhesive sheet 20 may vary in accordance with that of the joint.

A thermoplastic conductive adhesive is used for the electromagnetic shielding adhesive sheet 21 to make up the complex adhesive sheet 20. For example, a conductive substance such as silver or gold is suitably used in the material of the adhesive. Contrastingly, a thermoplastic insulating adhesive is used for the hermetically sealing adhesive sheet 22. For example, an epoxy adhesive can be used.

For making the complex adhesive sheet 20, used is a method of joining the electromagnetic shielding adhesive sheet 21 and the hermetically sealing adhesive sheet 22 by thermo-compression bonding. In this case, the materials of both sheets should have substantially the same glass transition temperature.

The glass transition temperature Tg is defined as follows. When the thermal expansion of a chain high polymer is measured, the specific capacity does not linearly change over the whole temperature range. Its gradient becomes smaller on the lower temperature side. There appears a turning point. When straight lines are extrapolated respectively from the higher and lower temperature sides, their intersecting point indicates the glass transition temperature Tg. At a lower temperature than Tg, the polymer becomes a glassy solid that is rigid and brittle. At a higher temperature than Tg, the thermal motion of molecular chains becomes active and rubber-like elasticity, viscosity, and the like, appear, and so deformation in response to an external force becomes easy.

As described above, in the complex adhesive sheet 20 of the present invention, materials for combination of a conductive adhesive and an insulating adhesive having substantially the same glass transition temperature Tg, are selected out of high polymer materials. Both are deformed at substantially the same temperature and joined by thermo-compression bonding.

As for the size of the complex adhesive sheet 20, X=about 30 mm, Y=about 40 mm, the width H=about 2 mm, and the thickness D=about 0.1 mm, as shown in FIG. 2A.

In the width H of this case, each width of the electromagnetic shielding adhesive sheet 21 and the hermetically sealing adhesive sheet 22 is about 1 mm. Each width of the electromagnetic shielding adhesive sheet 21 and the hermetically sealing adhesive sheet 22 is desirably determined into a proper value in accordance with high frequency shielding conditions. For example, in case of a MIC used under severe environmental conditions such as a ship or outer space, the width of the electromagnetic shielding adhesive sheet 21 is larger than 1 mm so as to enhance the hermetic shielding condition.

In this embodiment, the electromagnetic shielding adhesive sheet 21 and the hermetically sealing adhesive sheet 22 have the same thickness. But, the present invention is not limited to this feature.

Figure 3:
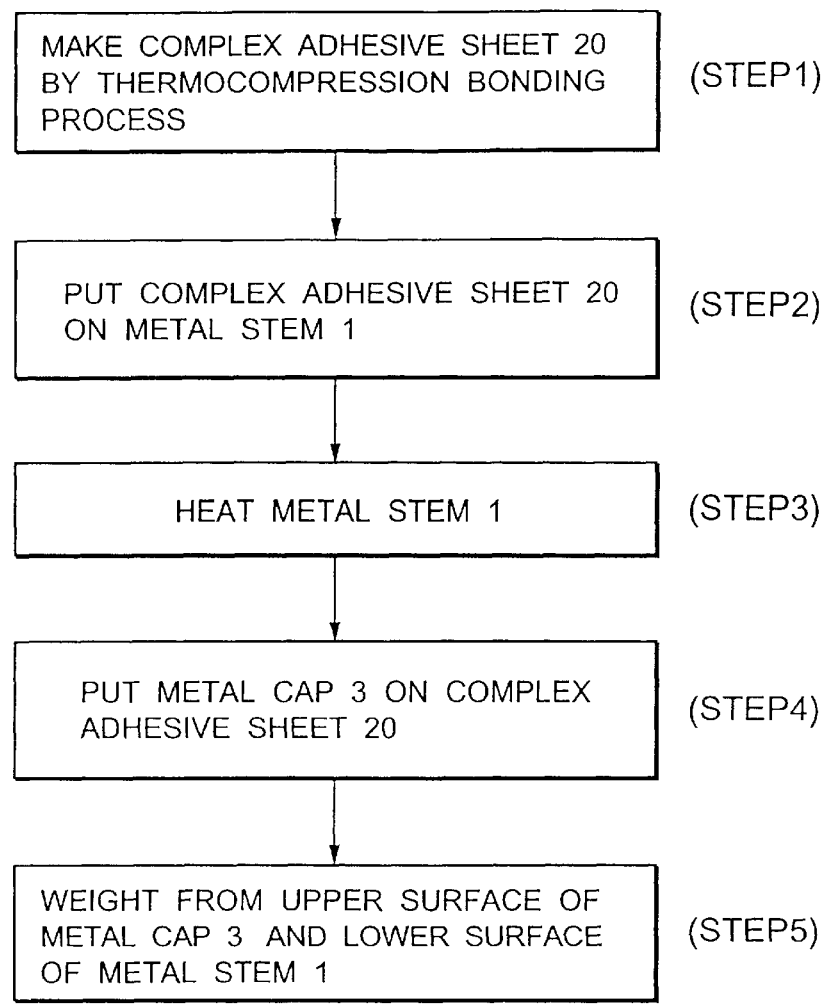
FIG. 3 is a flowchart for explaining a shielding method for a high frequency circuit according to the embodiment of the present invention.

FIG. 3 is a flowchart for explaining a method of attaching the complex adhesive sheet 20 to the MIC 10 in the shielding structure for the high frequency circuit according to the present invention.

Referring to FIG. 3, at first, the complex adhesive sheet is made by a thermo-compression bonding process (step 1). The above complex adhesive sheet 20 is mounted on the metal stem 1 (step 2). The metal stem 1 is then heated to about 230 to 250° C. (step 3). After this, the metal cap 3 is put on the complex adhesive sheet 20 (step 4). Lastly, weighting is performed from both the upper side of the metal cap 3 and the lower side of the metal stem 1 (step 5). Weighting in this case is desirably performed by about 20 to 30 kg.

Figure 4:
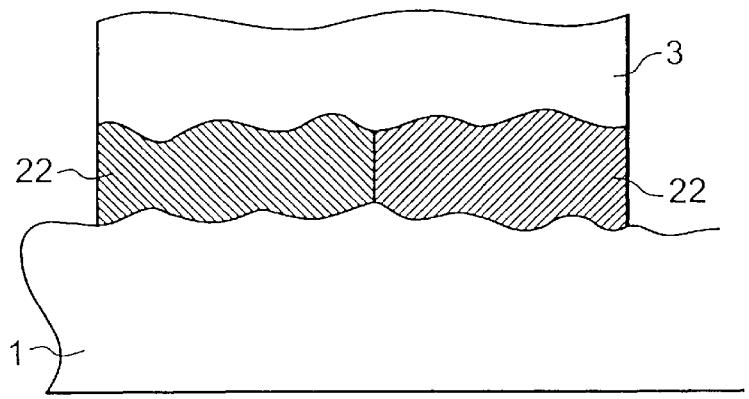
FIG. 4 is a sectional view illustrating a vicinity of the joint of the complex adhesive sheet.

FIG. 4 shows a sectional view of a vicinity of the bonding surfaces of the complex adhesive sheet 20, which has been attached to the MIC 10 in the above-described manner, to the metal stem 1 and the metal cap 3. As shown in FIG. 4, each surface of the metal stem 1 and the metal cap 3 has fine roughness even in case of having been polished. The complex adhesive sheet 20 of the present invention can fully fill up gaps of such roughness. As a result, the electromagnetic shielding adhesive sheet 21 can shield the MIC 10 from high frequency signals and the hermetically sealing adhesive sheet 22 can serve as hermetic shielding.

In the complex adhesive sheet 20 as described above, the electromagnetic shielding adhesive sheet 21 is provided on the side on which the high frequency circuit is placed, and the hermetically sealing adhesive sheet 22 is provided outside thereof. But, also in the inverse arrangement that the hermetically sealing adhesive sheet 22 is provided on the side on which the high frequency circuit is placed, and the electromagnetic shielding adhesive sheet 21 is provided outside thereof, the same effect can be obtained.

As a matter of course, the present invention can apply also to shielding structures for high frequency circuits other than the MIC 10, e.g., high frequency quartz oscillators, high frequency voltage control oscillators (VCOs), microwave multi-chip modules (MCMs).

(Embodiment 2)

Figure 5A:
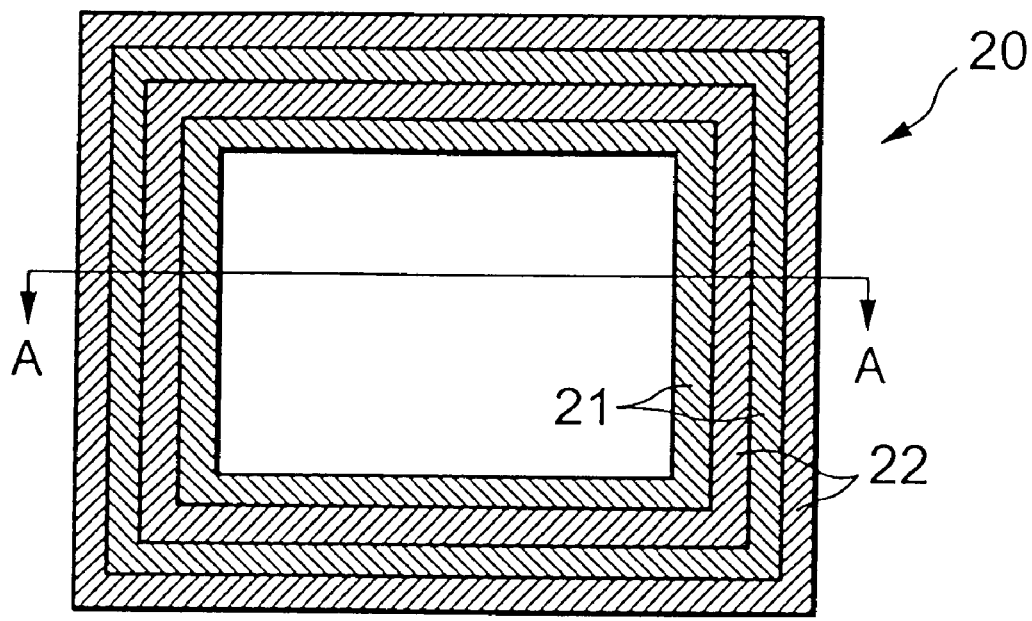
FIG. 5A is a plan view of a complex adhesive sheet according to another embodiment of the present invention.
Figure 5B:
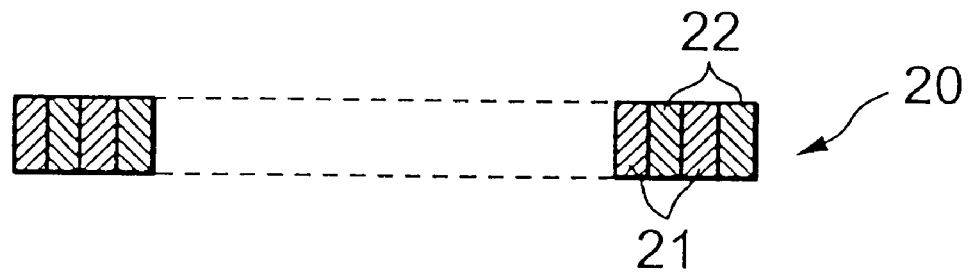
FIG. 5B is a sectional view of the complex adhesive sheet according to the embodiment of the present invention.

The complex adhesive sheet 20 of the above embodiment is made up by combining two sheets of the electromagnetic shielding adhesive sheet 21 and the hermetically sealing adhesive sheet 22. But, a larger number of sheets may be combined. For example, FIGS. 5A and 5B illustrate a complex adhesive sheet 20 made up from two electromagnetic shielding adhesive sheets 21 and two hermetically sealing adhesive sheets 22 that are alternately disposed. Such an alternate repetition of electromagnetic shielding and hermetic shielding according to this embodiment brings about an enhanced shielding effect.

(Embodiment 3)

Figure 6:
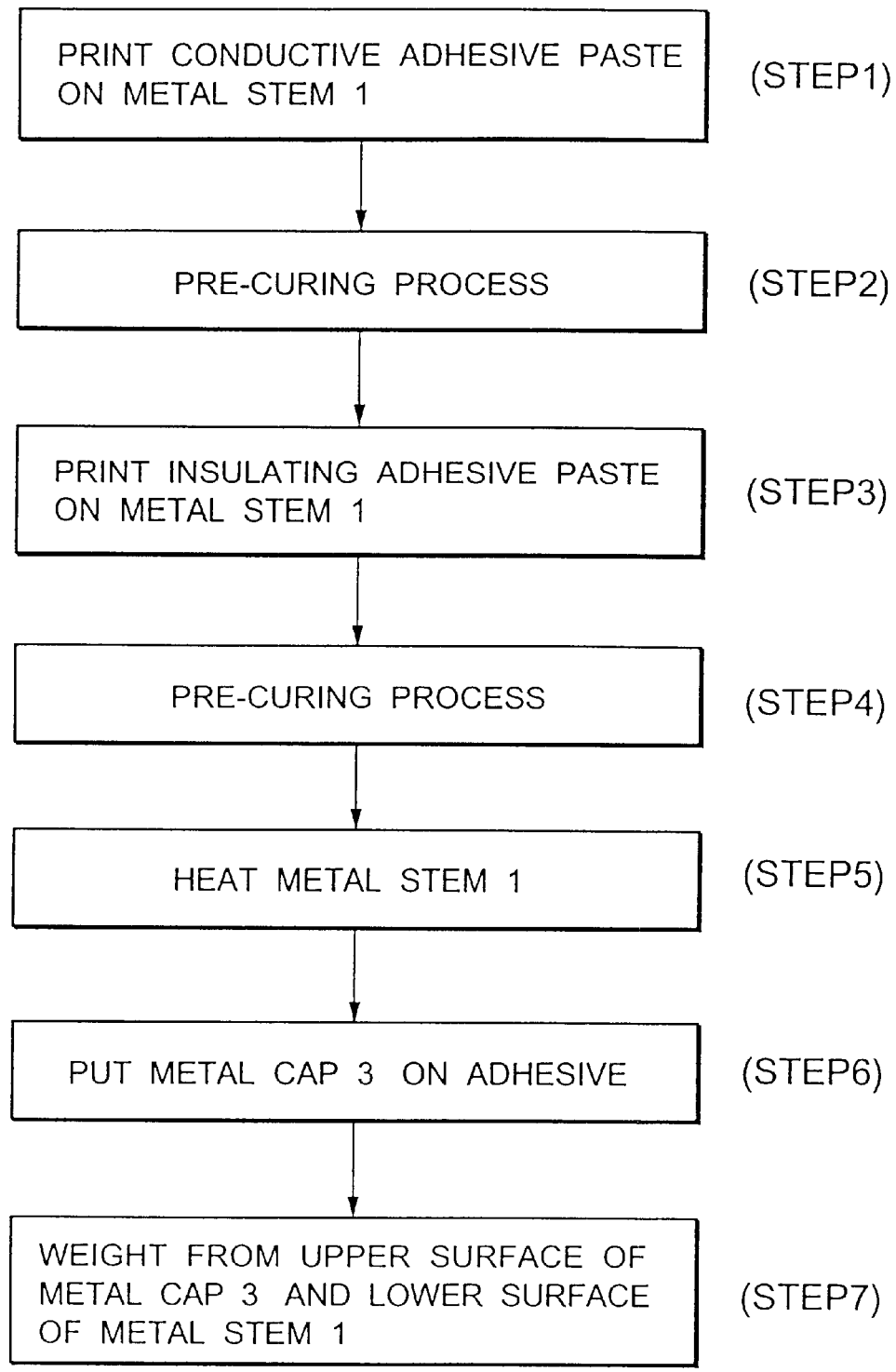
FIG. 6 is a flowchart for explaining a shielding method for a high frequency circuit according to still another embodiment of the present invention.

The above embodiments have been described with the complex adhesive sheet 20 all components of which are in the form of adhesive sheet. But, the present invention is not limited to such an adhesive sheet. For example, the same effect can be obtained also by printing or applying an electromagnetic shielding adhesive paste and a hermetically sealing adhesive paste at the joint between the metal stem 1 and the metal cap 3, into inside and outside ring shapes, respectively. FIG. 6 is a flowchart for explaining a method of providing a complex adhesive paste to the MIC 10 as a shielding structure for a high frequency circuit according to the present invention.

Referring to FIG. 6, at first, a conductive adhesive paste for electromagnetic shielding is printed on the joint surface of the metal stem 1 into a ring shape (step 1). After a pre-curing process (step 2), an insulating adhesive paste is printed on the joint surface of the metal stem 1 into a ring shape outside the conductive adhesive (step 3). After a pre-curing process (step 4), the metal stem 1 is heated to about 230 to 250° C. (step 5). After this, the metal cap 3 is put on the complex adhesive paste (step 6). Lastly, weighting is performed from both the upper side of the metal cap 3 and the lower side of the metal stem 1 (step 7). Weighting in this case is desirably performed by about 20 to 30 kg. For the conductive and insulating adhesive pastes, materials for combination of a conductive adhesive and an insulating adhesive having substantially the same glass transition temperature Tg, are selected out of high polymer materials. Both are deformed at substantially the same temperature and joined by thermo-compression bonding.

Each of the above-described shielding structures for a high frequency circuit according to the present invention does not have such a complicated shielding structure as includes application of a conductive adhesive to the joint between the metal stem and the metal cap, and welding of the whole periphery of the joint, which are performed conventionally. It affords the same electromagnetic shielding effect and hermetic seal effect as those of the conventional structure by only one joining operation with a complex adhesive. Therefore, the whole of the high frequency circuit can be easily manufactured.

Besides, since electromagnetic shielding and hermetic seal can be achieved by only providing the adhesive to only the joint between the metal stem and the metal cap, the periphery of the joint has need of no excessive space for welding or the like, unlike the conventional structure. This makes it possible to decrease the whole size of such a high frequency circuit.

Furthermore, the sheet width or applied quantity of the hermetically sealing adhesive of the complex adhesive can be varied in accordance with hermetic seal condition. If the sheet width of the hermetically sealing adhesive is decreased for a high frequency circuit under an easy hermetic seal condition, a smaller size can be achieved.

What is claimed is:

1. A shielding structure for a high frequency circuit comprising:
    a metal stem;
    a high frequency circuit mounted on an upper portion of said metal stem;
    a metal cap for covering the periphery of said high frequency circuit from above; and
    a complex adhesive in which a ring-shaped electromagnetic shielding adhesive and a ring-shaped hermetically sealing adhesive are joined by thermo-compression bonding, and which is provided at the joint between said metal cap and said metal stem.

2. A structure according to claim 1, wherein said complex adhesive is sheet-shaped.

3. A structure according to claim 1, wherein said complex adhesive is a paste printed or applied at said joint.

4. A structure according to claim 1, wherein said complex adhesive comprises ring-shaped electromagnetic shielding adhesives and ring-shaped hermetically sealing adhesives that are alternately disposed and joined by thermo-compression bonding.

5. A structure according to claim 4, wherein said electromagnetic shielding adhesives are thermoplastic conductive adhesives.

6. A structure according to claim 4, wherein said hermetically sealing adhesives are thermoplastic epoxy adhesives.

7. A structure according to claim 4, wherein materials having substantially the same glass transition temperature have been selected for said electromagnetic shielding adhesives and said hermetically sealing adhesives.

8. A shielding method for a high frequency circuit comprising steps of:
    putting a ring-shaped electromagnetic shielding adhesive and a ring-shaped hermetically sealing adhesive on a metal stem so as to abut each other;
    joining said electromagnetic shielding adhesive and said hermetically sealing adhesive by thermo-compression bonding to form a complex adhesive;
    putting a metal cap on said metal stem so that the joint surface of said metal cap is laid on an upper part of said complex adhesive; and
    weighting said metal stem and said metal cap.

* * * * *